(12) United States Patent
Lee et al.

(10) Patent No.: US 8,809,889 B2
(45) Date of Patent: Aug. 19, 2014

(54) LIGHT EMITTING DIODE PACKAGE AND DISPLAY APPARATUS INCLUDING THE SAME

(71) Applicant: Samsung Display Co., Ltd., Yongin (KR)

(72) Inventors: Baek Hee Lee, Yongin-si (KR); Jong Hyuk Kang, Suwon-si (KR); Junghyun Kwon, Seoul (KR); Minki Nam, Anseong-si (KR); Jae Byung Park, Seoul (KR); Seon-Tae Yoon, Seoul (KR); Dong-Hoon Lee, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/871,427

(22) Filed: Apr. 26, 2013

(65) Prior Publication Data

US 2014/0183582 A1 Jul. 3, 2014

(30) Foreign Application Priority Data

Jan. 3, 2013 (KR) ........................ 10-2013-0000628

(51) Int. Cl.
*H01L 33/00* (2010.01)
*H01L 33/50* (2010.01)
*B82Y 20/00* (2011.01)

(52) U.S. Cl.
CPC ................. *H01L 33/50* (2013.01); *B82Y 20/00* (2013.01); *Y10S 977/95* (2013.01); *Y10S 977/774* (2013.01)
USPC .. 257/98; 257/99; 257/E33.06; 257/E33.061; 977/950; 977/774

(58) Field of Classification Search
USPC ......................... 257/98, 99, E33.06, E33.061
See application file for complete search history.

(56) References Cited

U.S. PATENT DOCUMENTS

| 6,791,259 B1 | 9/2004 | Stokes et al. |
| 7,492,458 B2 | 2/2009 | Malak |

(Continued)

FOREIGN PATENT DOCUMENTS

| JP | 2009-013412 | 1/2009 |
| JP | 2009-038260 | 2/2009 |

(Continued)

OTHER PUBLICATIONS

Seong Min Lee, et al., "Localized surface plasmon enhanced cathodoluminescence from Eu3+-doped phosphor near the nanoscaled silver particles," Jul. 4, 2011, pp. 13209-13217, vol. 19, No. 14, Optics Express.

(Continued)

*Primary Examiner* — Tu-Tu Ho
(74) *Attorney, Agent, or Firm* — H.C. Park & Associates, PLC

(57) ABSTRACT

A light emitting diode package includes a light emitting diode, an insulating layer, a plurality of light emitting particles, and a plurality of metal particles. The light emitting diode is configured to emit first light of a first wavelength in a visible light range. The insulating layer is disposed on the light emitting diode. The plurality of light emitting particles is dispersed in the insulating layer and is configured to receive the first light to generate a second light of a second wavelength different from the first wavelength. The plurality of metal particles is dispersed in the insulating layer, and is configured to receive at least one light component of the first light and the second light to cause, at least in part, surface plasmon resonance, the surface plasmon resonance being configured to yield a resonance wave comprising a peak wavelength in the range of the second wavelength.

20 Claims, 7 Drawing Sheets

(56) References Cited

U.S. PATENT DOCUMENTS

| | | |
|---|---|---|
| 7,615,248 B2 | 11/2009 | Choi et al. |
| 7,816,855 B2 | 10/2010 | Cho et al. |
| 2006/0081862 A1* | 4/2006 | Chua et al. .............. 257/98 |
| 2011/0006668 A1 | 1/2011 | Hussell et al. |
| 2012/0064134 A1* | 3/2012 | Bourke, Jr. et al. ........ 424/401 |
| 2012/0193667 A1 | 8/2012 | Choi et al. |
| 2012/0326180 A1* | 12/2012 | Ohe et al. .............. 257/88 |

FOREIGN PATENT DOCUMENTS

| | | |
|---|---|---|
| KR | 10-0280993 | 2/2001 |
| KR | 10-0899940 | 5/2009 |
| KR | 10-0966373 | 6/2010 |
| KR | 10-1017583 | 2/2011 |
| KR | 10-1048378 | 7/2011 |
| KR | 10-1062789 | 9/2011 |
| KR | 10-2011-0115509 | 10/2011 |
| KR | 10-1104688 | 1/2012 |
| KR | 10-2012-0028671 | 3/2012 |
| KR | 10-1139891 | 4/2012 |
| KR | 10-1176510 | 8/2012 |
| KR | 10-1182359 | 9/2012 |
| KR | 10-2014-0015763 | 2/2014 |

OTHER PUBLICATIONS

Seong Min Lee, et al., "Enhanced emission from BaMgAl10O17:Eu2+ by localized surface plasmon resonance of silver particles," May 24, 2010, pp. 12144-12152, vol. 18, No. 12, Optics Express.

* cited by examiner

LIGHT EMITTING DIODE PACKAGE AND DISPLAY APPARATUS INCLUDING THE SAME

CROSS-REFERENCE TO RELATED APPLICATION

This application claims priority from and the benefit of Korean Patent Application No. 10-2013-0000628, filed on Jan. 3, 2013, which is incorporated by reference for all purposes as if set forth herein.

BACKGROUND

1. Field

Exemplary embodiments relate to a light emitting diode package and a display apparatus including the same.

2. Discussion

Light emitting diode packages including light emitting diodes are widely used as light sources in display devices. It is noted that light emitting diodes are typically driven by a voltage lower than that of cold-cathode fluorescent lamps, as well as emit brighter light. Accordingly, light emitting diode packages are widely used in not only display devices, but also in lighting devices in general.

Typically, the color of light emitted from a light emitting diode package is controlled based on the combination of light emitted by a plurality of light emitting diodes of different colors. In this manner, however, a driving circuit of the light emitting diode package, which is used to drive the plurality of light emitting diodes, may become complicated, and as such, it may be difficult to reduce the size of the light emitting diode package. Accordingly, light emitting diode packages including a fluorescent substance and a quantum dot have been developed to control the color of light emitted from the light emitting diode packages.

The fluorescent substance and the quantum dot receive the light emitted from the plurality of light emitting diodes and change a wavelength of the light emitted from the various light emitting diodes. As such, the color of light emitted from the light emitting diode package may controlled by the wavelength of the light emitted from the fluorescent substance and the quantum dot. It is noted, however, that when a light emitting efficiency of the fluorescent substance and the quantum dot is improved, a power consumption of the light emitting diode package may be reduced.

Therefore, there is a need for an approach that provides efficient, cost effective techniques to improve the light emitting efficiency and power consumption of light emitting diode packages.

The above information disclosed in this Background section is only for enhancement of understanding of the background of the invention, and therefore, it may contain information that does not form the prior art that is already known in this country to a person of ordinary skill in the art.

SUMMARY

Exemplary embodiments provide a light emitting diode package configured to improve a light emitting efficiency of the light emitting diode package, as well as lower the power consumption thereof.

Exemplary embodiments provide a display apparatus including the light emitting diode package as a light source.

Additional aspects will be set forth in the detailed description which follows and, in part, will be apparent from the disclosure, or may be learned by practice of the invention.

According to exemplary embodiments, a light emitting diode package includes a light emitting diode, an insulating layer, a plurality of light emitting particles, and a plurality of metal particles. The light emitting diode is configured to emit first light of a first wavelength in a visible light range. The insulating layer is disposed on the light emitting diode. The plurality of light emitting particles is dispersed in the insulating layer, the plurality of light emitting particles being configured to receive the first light to generate second light of a second wavelength, the second wavelength being different from the first wavelength. The plurality of metal particles being dispersed in the insulating layer, the plurality of metal particles being configured to receive at least one light component of the first light and the second light. The reception of the at least one light component is configured to cause, at least in part, surface plasmon resonance, the surface plasmon resonance being configured to yield a resonance wave comprising a peak wavelength in the range of the second wavelength.

According to exemplary embodiments, a display apparatus includes a light emitting diode package configured to emit light and a display panel configured to receive the light to display an image. The light emitting diode package includes a light emitting diode, an insulating layer, a plurality of light emitting particles, and a plurality of metal particles. The light emitting diode is configured to emit first light of a first wavelength in a visible light range. The insulating layer is disposed on the light emitting diode. The plurality of light emitting particles is dispersed in the insulating layer, the plurality of light emitting particles being configured to receive the first light to generate second light of a second wavelength, the second wavelength being different from the first wavelength. The plurality of metal particles being dispersed in the insulating layer, the plurality of metal particles being configured to receive at least one light component of the first light and the second light. The reception of the at least one light component is configured to cause, at least in part, surface plasmon resonance, the surface plasmon resonance being configured to yield a resonance wave comprising a peak wavelength in the range of the second wavelength.

According to exemplary embodiments, the light emitting efficiency of the plurality of light emitting particles may be improved by resonant coupling of light between light radiating from the plurality of light emitting particles and the resonance wave radiating from the plurality of metal particles. As such, even if the intensity of light incident to the plurality of light emitting particles when the power consumption of the light emitting diode is reduced, the light emitting diode package may still be driven at a low voltage because the plurality of light emitting particles may emit light having enough intensity when improved by the resonant coupling of light associated with the resonance wave radiating from the plurality of metal particles.

According to exemplary embodiments, the light emitting diode package including the plurality of metal particles used to improve the light emitting efficiency of the plurality of light emitting particles may be easily manufactured, and the plurality of light emitting particles may be prevented (or otherwise reduced) from being chemically varied due to contact between the plurality of metal particles and the plurality of light emitting particles.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
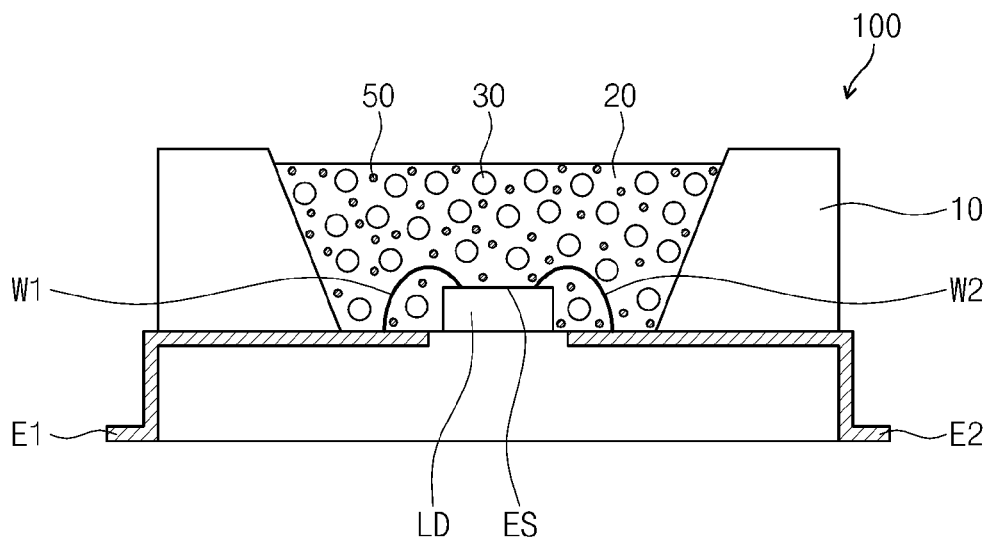
FIG. 1 is a cross-sectional view of a light emitting diode package, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. As such, a first element, component, region, layer, or section discussed below could be termed a second element, component, region, layer, or section without departing from the teachings of the present disclosure.

Spatially relative terms, such as "beneath," "below," "lower," "above," "upper," and the like, may be used herein for descriptive purposes, and thereby, to describe one element or feature's relationship to another element(s) or feature(s) as illustrated in the drawings. Spatially relative terms are intended to encompass different orientations of an apparatus (or device) in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure belongs. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2A:
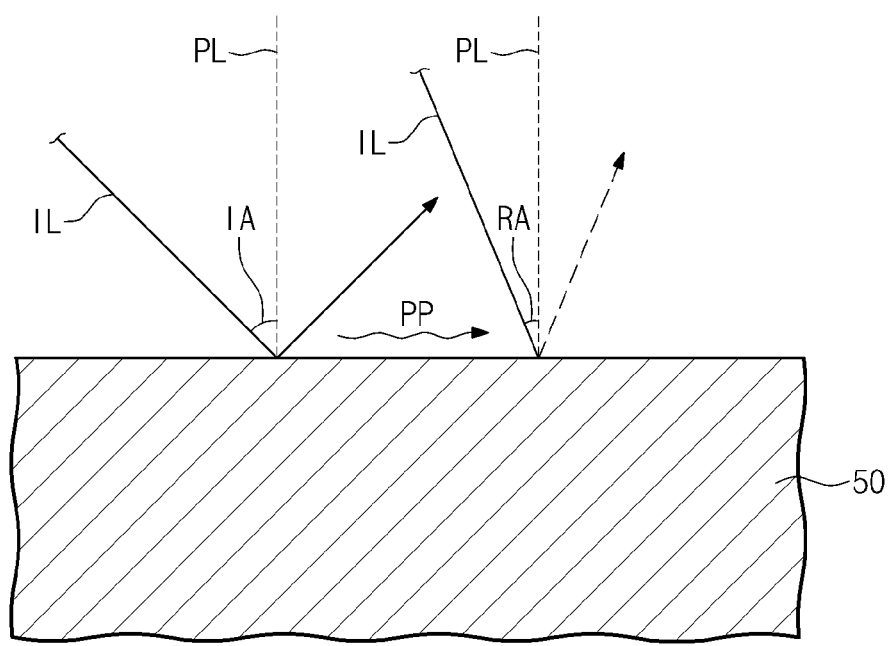
FIG. 2A is an enlarged, cross-sectional view of a surface of one of the metal particles of the light emitting diode package of FIG. 1, according to exemplary embodiments.
Figure 2B:
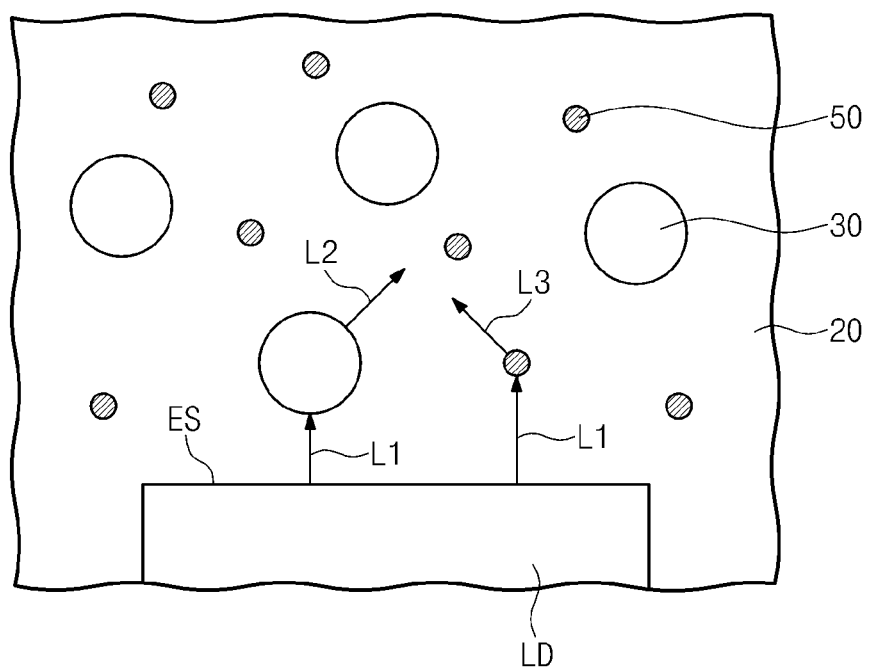
FIG. 2B is an enlarged, cross-sectional view of the light emitting diode package of FIG. 1, according to exemplary embodiments.

FIG. 1 is a cross-sectional view of a light emitting diode package, according to exemplary embodiments. FIG. 2A is an enlarged, cross-sectional view of a surface of one of metal particles of the light emitting diode package of FIG. 1. FIG. 2B is an enlarged, cross-sectional view of the light emitting diode package of FIG. 1.

Referring to FIGS. 1-2B, a light emitting diode (LED) package 100, according to exemplary embodiments, includes a mold 10, a light emitting diode LD, an insulating layer 20, light emitting particles 30, metal particles 50, a first electrical terminal E1, a second electrical terminal E2, a first wire W1, and a second wire W2. While specific reference will be made to this particular implementation, it is also contemplated that LED package 100 may embody many forms and include multiple and/or alternative components. For example, it is contemplated that the components of LED package 100 may be combined, located in separate structures, and/or separate locations.

The mold 10 includes a receiving space to accommodate the light emitting diode LD and an upper portion of the mold 10 is opened. According to exemplary embodiments, the mold 10 includes any suitable insulating material. For instance, the mold 10 may include a plastic material, such as polyphthalamide (PPA).

The light emitting diode LD is accommodated in the receiving space, and thereby, configured to emit a first light L1. In this manner, the first light L1 exits a light exiting surface ES of the light emitting diode LD. The light emitting diode LD includes a PN junction (not shown) formed of any suitable semiconductor material, or combination of semiconductor materials. As such, the light emitting diode LD may emit the first light L1 using energy generated by a recombination of an electron and a hole at the PN junction. In exemplary embodiments, the semiconductor material(s) may include any suitable semiconductor oxide, such as, for example, gallium arsenide (GaAs), gallium phosphide (GaP), indium phosphide (InP), etc.

The first light L1 may have a wavelength (or range of wavelengths) in the visible light range. According to exemplary embodiments, the first light L1 has a wavelength in a blue light range. That is, when an ultraviolet ray has a wavelength smaller than 400 nm, the first light L1 has the wavelength of about 400 nm to about 500 nm, but any other suitable range may be utilized. For instance, the first light L1 may have a wavelength of about 500 nm to about 580 nm in a green light range.

The insulating layer 20 may be disposed in the receiving space of the mold 10 to cover the light emitting diode LD. The insulating layer 20 may include an insulating material having a light transmittance, e.g., silicon resin, epoxy resin, etc. As such, the first light L1 emitted from the light emitting diode LD may travel to the outside of the insulating layer 20 after passing through the insulating layer 20 or may be provided to a light emitting particle 30 distributed in the insulating layer 20.

The first electrical terminal E1 and the second electrical terminal E2 include any suitable conductive material. The first electrical terminal E1 is electrically connected to a first (e.g., positive) terminal of the light emitting diode LD, and the second electrical terminal E2 is electrically connected to a second (e.g., negative) terminal of the light emitting diode LD, or vice versa. In addition, respective first ends of the first and second electrical terminals E1 and E2 may be disposed inside the receiving space of the mold 10 and corresponding second ends of the first and second electrical terminals E1 and E2 may be disposed outside of the mold 10.

According to exemplary embodiments, the first wire W1 is electrically connected between the first terminal of the light emitting diode LD and the first electrical terminal E1, and the second wire W2 is electrically connected between the second terminal of the light emitting diode LD and the second electrical terminal E2. In this manner, when the first and second electrical terminals E1 and E2 are connected to an external power source (not shown), power generated by the external power source may be applied to the light emitting diode LD, and the light emitting diode LD may emit the first light L1.

The light emitting particles 30 may be disposed in the insulating layer 20. In exemplary embodiments, the light emitting particles 30 may be any suitable fluorescent substance. To this end, the light emitting particles 30 may receive the first light L1, and thereby, generate a second light L2 of a wavelength (or range of wavelengths) different from that of the first light L1.

It is noted that the selection of material utilized to fabricate the light emitting particles 30 may be dependent upon the wavelength of the first light L1 and an intended wavelength of an exit light exiting from the LED package 100. For instance, when the first light L1 has a wavelength in the blue light range and the exit light exiting from the LED package 100 is a red light, the light emitting particles 30 may be any suitable fluorescent substance that receives the first light L1 and generates the second light L2 having the wavelength in the red light range.

According to exemplary embodiments, the wavelength and the color of the exit light may be controlled by an amount of the light emitting particles 30 provided (or otherwise dispersed) in the insulating layer 20. For instance, when the first light L1 has a wavelength in the blue light range and the light emitting particles 30 generate the second light L2 having a wavelength in the green light range, the color of the exit light may become closer to the blue color as the amount of the light emitting particles 30 dispersed in the insulating layer 20 decreases, and the color of the exit light may become closer to the green color as the amount of the light emitting particles 30 dispersed in the insulating layer 20 increases. As such, it is contemplated that the amount, material, shape, size, etc., of light emitting particles 30 dispersed in insulating layer 20 may be uniform or non-uniform in one or more axial directions. For instance, the amount, material, shape, size, etc., of light emitting particles 30 may be varied along a first direction (e.g., parallel to light exiting surface ES), such that light radiating from the opening of mold 10 may exhibit different wavelengths, which may be combined to generate light of a suitable color, such as combined to generate white light. Additionally (or alternatively), the amount, material, shape, size, etc., of light emitting particles 30 may be varied along a second direction (e.g., perpendicular to light exiting surface ES), such that light of various wavelengths may be combined to generate light of a suitable color.

According to exemplary embodiments, the metal particles 50 are dispersed in the insulating layer 20. For instance, the metal particles 50 may be randomly dispersed in the insulating layer 20. That is, positions of the metal particles 50 may not be related to the positions of the light emitting particles 30, and as such, the metal particles 50 may be easily dispersed in the insulating layer 20 when viewed in relation to the manufacturing method of the LED package 100. In exemplary embodiments, most of the metal particles 50 may be spaced apart from the light emitting particles 30 in the insulating layer 20, but a portion of the metal particles 50 may be disposed at (or near) a surface of the light emitting particles 30 since the metal particles 50 are randomly dispersed.

According to exemplary embodiments, a weight ratio between the light emitting particles 30 and the metal particles 50 may be in a range of 100:0.005 to 100:5, such as in a range of 100:0.005 to 100:0.1. When the weight ratio of the metal particles 50 to the light emitting particles 30 is less than about 0.005 weight percent, the light emitting efficiency of the light emitting particles 30 may not be noticeably improved by resonant coupling of light, as will become more apparent below. Further, when the weight ratio of the metal particles 50 to the light emitting particles 30 is more than about 5 weight percent, the amount of the light exiting from the LED package 100 may be reduced by optical reflection of the metal particles 50. It is noted that an exemplary metal particle 50 is described in more detail in association with FIG. 2A.

According to exemplary embodiments, the metal particle 50 may have a particle shape and be formed of the metal material. In FIGS. 1 and 2B, the metal particle 50 has a spherical shape; however, it is contemplated that any other suitable shape may be utilized. That is, the metal particle 50 may have various shapes, such as, for example, a bar shape, a tetrahedral shape, a hexahedral shape, an octahedral shape, etc. The metal particle 50 may be formed from any suitable metal metallic material, such as, for instance, gold, silver, aluminum, white gold, palladium, platinum, cadmium, cobalt, ruthenium, copper, indium, nickel, iron, and/or an alloy thereof. To this end, it is noted that various different types of metal particles 50 may be utilized, such as various different sizes, shapes, materials, etc.

In exemplary embodiments, a surface plasmon, in which electrons are collectively vibrated (e.g., coherently oscillated), occurs on a surface of the metal particle 50 when excited, such that a surface plasmon wave PP is generated by the surface plasmon as a kind (or form) of electromagnetic wave. It is noted that a surface plasmon wave is different from a conventional electromagnetic wave that randomly travels through space, as the surface plasmon wave PP travels along the surface of the metal particle 50.

Accordingly, when at least one light component of the first light L1 and/or the second light L2 is incident on the metal particle 50, the light component may be referred to as an incident light IL. An angle at which the incident light IL is incident on the metal particle 50, i.e., an angle between a normal line PL vertical to the surface of the metal particle 50 and the incident light IL, is referred to as an incident angle IA. In this manner, a phase of the incident light IL may be matched with a phase of the surface plasmon wave PP at a value of the incident angle IA. According to exemplary embodiments, the energy of the incident light IL may be absorbed by the metal particle 50, and as a result, a distribution of an electric field vertical to a surface of the metal particle 50 may be exponentially increased. The distribution of the electric field, however, may be reduced as the electric field extends in to the metal particle 50. This is referred to as surface plasmon resonance, e.g., collective oscillation of valence electrons in metal particle 50 as a result of the incident light IL. As such, the incident angle IA at which the surface plasmon resonance occurs may be referred to as surface plasmon resonance angle RA. In other words, the resonance condition occurs when the frequency of light photons of the incident light IL matches (or substantially matches) the natural frequency of surface electrons oscillating against the restoring force of a positive nuclei.

According to exemplary embodiments, a localized electric field may occur on the surface of the metal particle 50 as a result of the surface plasmon resonance. As such, a resonance wave L3 may be generated, and thereby, reflected from the metal particle 50. When the resonance wave L3 propagates from the metal particle 50, and a peak wavelength of the resonance wave L3 is in the wavelength range of the second light L2, the second light L2 may be amplified by the resonance wave L1. This may be referred to as resonant coupling of light.

In exemplary embodiments, the light emitting efficiency of the light emitting particles 30 is improved by the resonant coupling of light, and to this end, an intensity of the second light L2 emitted from the light emitting particles 30 may be enhanced. Therefore, although an intensity of the first light L1 may be reduced, the intensity of the second light L2 may be sufficiently enhanced by the resonant coupling of light, thereby, reducing the power consumption in the light emitting diode LD.

Figure 3A:
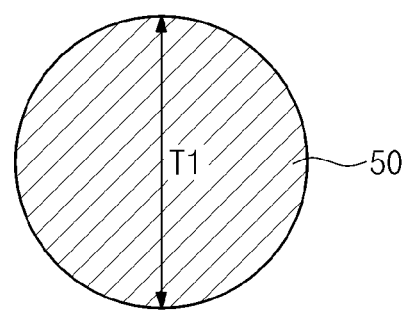
FIG. 3A is a cross-sectional view of a metal particle of FIG. 2B, according to exemplary embodiments.
Figure 3B:
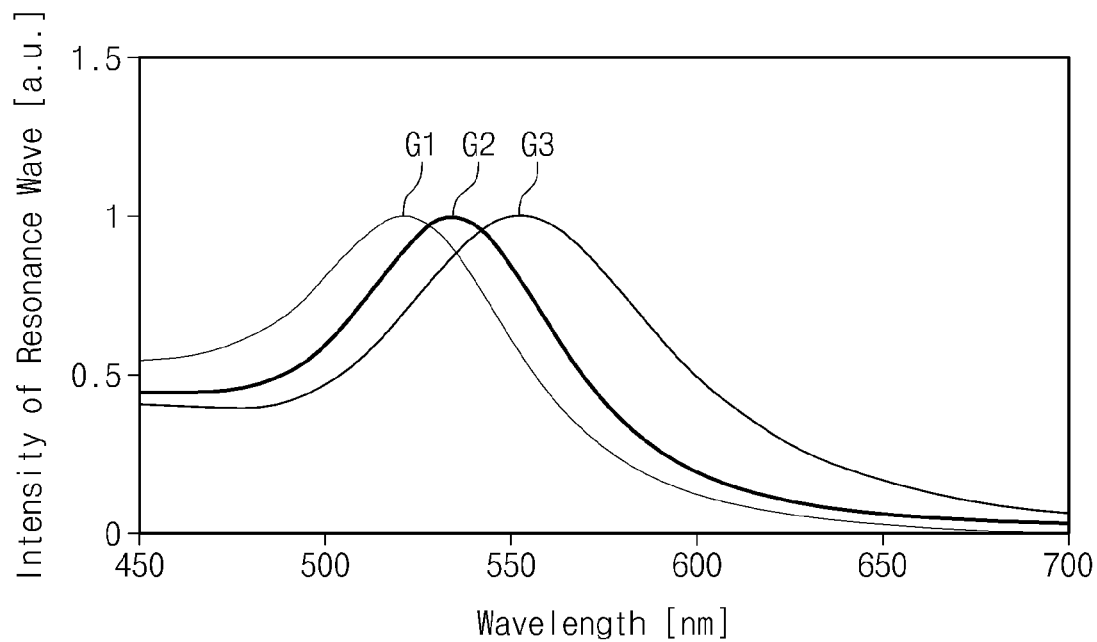
FIG. 3B is a graph comparing a size of a metal particle to a peak wavelength of a resonance wave propagating from the metal particle, according to exemplary embodiments.

FIG. 3A is a cross-sectional view of a metal particle of FIG. 2B, according to exemplary embodiments. FIG. 3B is a graph comparing a size of the metal particle to the peak wavelength of a resonance wave propagating from the metal particle, according to exemplary embodiments.

Referring to FIGS. 2B-3B, first, second, and third graphs G1, G2, and G3 represent a relative value of the intensity of the resonance wave L3 propagating from the metal particle 50 in an arbitrary unit according to the size T1 of the metal particle 50.

As represented by the first graph G1, when the size T1 of the metal particle 50 is about 20 nm, the peak wavelength of the resonance wave L3 is in a range from about 510 nm to about 530 nm. Accordingly, when the size T1 of the metal particle 50 is about 20 nm, the peak wavelength of the resonance wave L3 is in the wavelength range of the green light, e.g., from about 500 nm to about 580 nm.

As represented by the second graph G2, when the size T1 of the metal particle 50 is about 50 nm, the peak wavelength of the resonance wave L3 is in a range from about 530 nm to about 550 nm. Accordingly, when the size T1 of the metal particle 50 is about 50 nm, the peak wavelength of the resonance wave L3 is in the wavelength range of the green light, e.g., from about 500 nm to about 580 nm.

As represented by the third graph G3, when the size T1 of the metal particle 50 is about 80 nm, the peak wavelength of the resonance wave L3 is in a range from about 550 nm to about 570 nm. Accordingly, when the size T1 of the metal particle 50 is about 80 nm, the peak wavelength of the resonance wave L3 is in the wavelength range of the green light, e.g., from about 500 nm to about 580 nm.

According to the first, second, and third graphs G1, G2, and G3, the range of the peak wavelength of the resonance wave L3 propagating from the metal particle 50 is changed in accordance with the size T1 of the metal particle 50. As such, when the peak wavelength of the resonance wave L3 is adjusted, such that the peak wavelength of the resonance wave is in the wavelength range of the second light propagating from the light emitting particles 30, resonant coupling of light may result between the second light and the resonance wave L3.

Table 1, as shown below, represents the peak wavelength of the resonance wave according to the material and size of the metal particle 50 in various exemplary embodiments.

TABLE 1

| | Material Of Metal Particle | Size of Metal Particle | Range of Peak Wavelength of Resonance Wave | Wavelength Range of Light |
|---|---|---|---|---|
| First Exemplary Embodiment | Gold (Au) | 5 nm~ 100 nm | 500 nm~ 580 nm | Green Light |
| Second Exemplary Embodiment | Gold (Au) | 1 nm~ 150 nm | 430 nm~ 600 nm | Visible Light |

TABLE 1-continued

| | Material Of Metal Particle | Size of Metal Particle | Range of Peak Wavelength of Resonance Wave | Wavelength Range of Light |
|---|---|---|---|---|
| Third Exemplary Embodiment | Aluminum (Al) | 5 nm~ 100 nm | 400 nm~ 550 nm | Blue and Green Light |
| Fourth Exemplary Embodiment | Silver (Ag) | 1 nm~ 150 nm | 430 nm~ 600 nm | Visible Light |

In the first exemplary embodiment of Table 1, when the metal particle 50 includes gold and has the size T1 of about 5 nm to about 100 nm, the range of the peak wavelength of the resonance wave L3 is in the wavelength range of green light, e.g., in the wavelength range from about 500 nm to about 580 nm. Accordingly, when the light emitting particles 30 include green fluorescent substances, the resonant coupling of light may be easily caused between the resonance wave L3 and the second light L2 of the light emitting particles 30.

In the second exemplary embodiment of Table 1, when the metal particle 50 includes gold and has the size T1 of about 1 nm to about 150 nm, the range of the peak wavelength of the resonance wave L3 is in the wavelength range of visible light, e.g., in the wavelength range from about 430 nm to about 600 nm.

In the third exemplary embodiment of Table 1, when the metal particle 50 includes aluminum and has the size T1 of about 5 nm to about 100 nm, the range of the peak wavelength of the resonance wave L3 is in the wavelength range of blue and green lights, e.g., in the wavelength range from about 400 nm to about 550 nm.

In the fourth exemplary embodiment of Table 1, when the metal particle 50 includes silver and has the size T1 of about 1 nm to about 150 nm, the range of the peak wavelength of the resonance wave L3 is in the wavelength range of visible light, e.g., in the wavelength range from about 430 nm to about 600 nm.

Figure 4A:
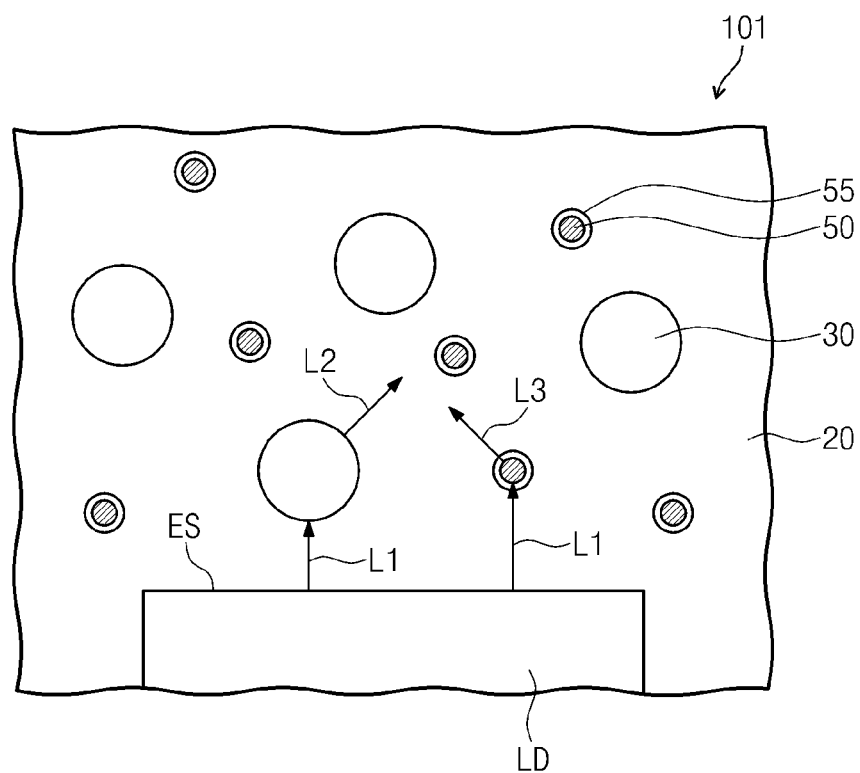
FIG. 4A is an enlarged, cross-sectional view of a light emitting diode package, according to exemplary embodiments.
Figure 4B:
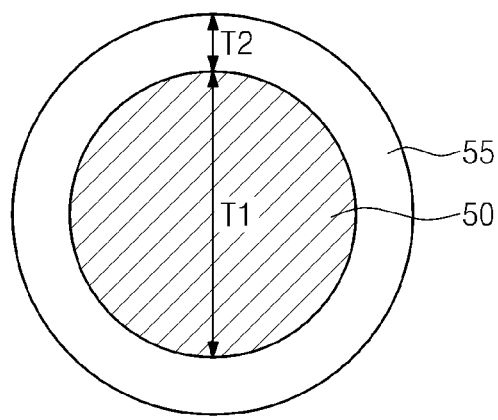
FIG. 4B is a cross-sectional view of a metal particle of the light emitting diode of FIG. 4A, according to exemplary embodiments.

FIG. 4A is an enlarged, cross-sectional view of a light emitting diode package, according to exemplary embodiments. FIG. 4B is a cross-sectional view of a metal particle of the light emitting diode of FIG. 4A. In FIGS. 4A and 4B, the same reference numerals denote the same elements as in FIGS. 1, 2A, and 2B, and therefore, to avoid obscuring exemplary embodiments disclosed herein, duplicative descriptions of the same elements will be omitted.

Referring to FIGS. 4A and 4B, an LED package 101 includes a light emitting diode LD, insulating layer 20, light emitting particles 30, and metal particles 50. Each of the metal particles 50 is coated with a dielectric layer 55.

According to exemplary embodiments, the dielectric layer 55 includes an insulating material having a light transmittance. For instance, the dielectric layer 55 may include any suitable oxide (e.g., titanium oxide, silicon oxide, magnesium oxide, aluminum oxide, or yttrium oxide) or any suitable nitride (e.g., silicon nitride or aluminum nitride).

The dielectric layer 55 has a thickness T2 of about 1 nm to about 500 nm, e.g., about 50 nm to about 450 nm, such as about 200 nm to about 300 nm. In addition, when the thickness T2 of the dielectric layer 55 is controlled in the range from about 1 nm to about 500 nm, the range of the peak wavelength of the resonance wave L3 (as described in association with FIG. 2B) of the metal particles 50 may be changed in accordance with the thickness T2 of the dielectric layer 55. For instance, in the case that each metal particle 50 includes gold and has a size of about 80 nm, the wavelength of the resonance wave L3 may be about 550 nm when the dielectric layer 55 is not provided, and the wavelength of the resonance wave L3 may be increased by tens of nanometers as the thickness T2 of the dielectric layer 55 is increased in the range from about 1 nm to about 500 nm.

As seen in FIGS. 4A and 4B, each metal particle 50 is coated with the dielectric layer 55; however, it is also contemplated that a first portion of the metal particles 50 may be coated with the dielectric layer 55 and a second portion of the metal particles 50 may not be coated with the dielectric layer 55. Further, it is also contemplated that at least some of the metal particles 50 may be at least partially coated with the dielectric layer 55 and at least some of the metal particles may not be coated with the dielectric layer 55.

Figure 5A:
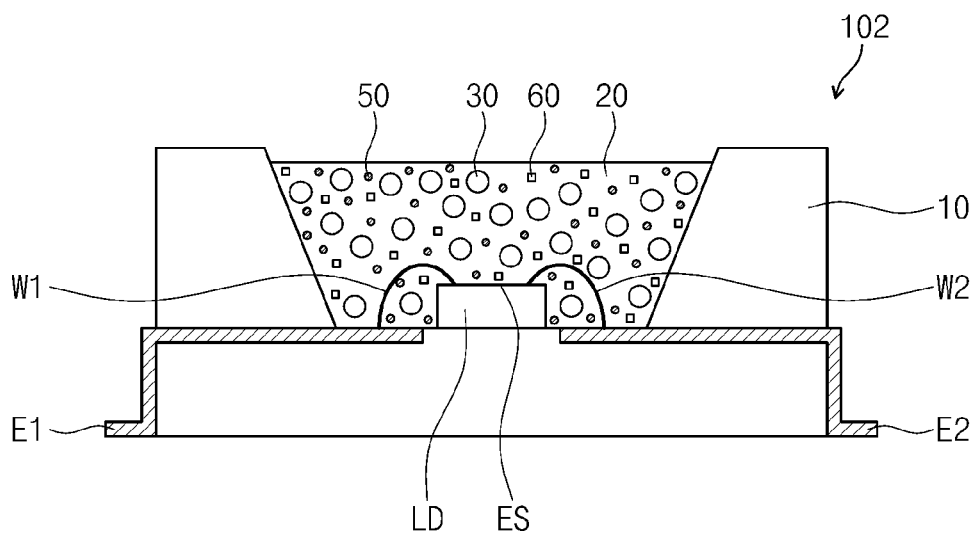
FIG. 5A is a cross-sectional view of a light emitting diode package, according to exemplary embodiments.
Figure 5B:
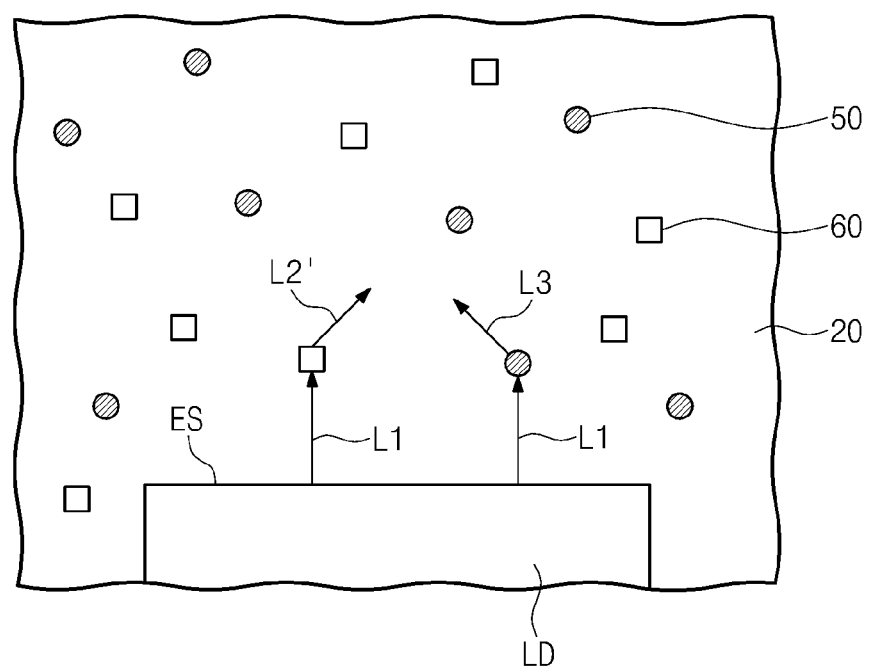
FIG. 5B is an enlarged, cross-sectional view of a portion of the light emitting diode package of FIG. 5A, according to exemplary embodiments.

FIG. 5A is a cross-sectional view of a light emitting diode package, according to exemplary embodiments. FIG. 5B is an enlarged, cross-sectional view of a portion of the light emitting diode package of FIG. 5A. In FIGS. 5A and 5B, the same reference numerals denote the same elements as in FIGS. 1, 2A, and 2B, and therefore, to avoid obscuring exemplary embodiments disclosed herein, duplicative descriptions of the same elements will be omitted.

Referring to FIGS. 5A and 5B, an LED package 102 includes light emitting particles 60 dispersed in the insulating layer 20. The light emitting particles 60 may be quantum dots. The quantum dots 60 receive the first light L1 generated by the light emitting diode LD and generate a second light L2' having a wavelength different from that of the first light L1. In exemplary embodiments, each quantum dot 60 has a size of a few nanometers to hundreds of nanometers. As the size of the quantum dots 60 is decreased, the wavelength of the second light L2' becomes smaller, and the wavelength of the second light L2' becomes larger as the size of the quantum dots 60 is increased.

According to exemplary embodiments, when the peak wavelength of the resonance wave L3 generated by the metal particles 30 is in the range of the wavelength of the second light L2' generated by the light emitting particles 60, the resonant coupling of light may occur between the resonance wave L3 and the second light L2' as previously described in association with FIGS. 1-2B. Accordingly, the light emitting efficiency of the light emitting particles 30 may be improved by the resonant coupling of light, and as such, an intensity of the second light L2' emitted from the light emitting particles 30 may be enhanced. Therefore, even if the intensity of the first light L1 is reduced, the intensity of the second light L2' may be sufficiently enhanced by the resonant coupling of light associated with the resonance wave L3.

According to exemplary embodiments, the quantum dots are used as the light emitting particles 60; however, it is also contemplated that the quantum dots and a fluorescent substance may be used as the light emitting particles 60. In this manner, the quantum dots and the fluorescent substances may be randomly dispersed in the insulating layer 20 as the light emitting particles 60, and the resonant coupling of light may occur between the light emitting from the quantum dots and the resonance wave L3 and between the fluorescent substances and the resonance wave L3.

In exemplary embodiments, a weight ratio between the light emitting particles 60 and the metal particles 50 may be in a range of 100:0.1 to 100:5, e.g., in a range of 100:0.1 to 100:1. When the weight ratio of the metal particles 50 to the light emitting particles 60 is less than about 0.1 weight percent, the light emitting efficiency of the light emitting particles 30 may not be improved by the resonant coupling of light. Further, when the weight ratio of the metal particles 50 to the light emitting particles 60 is more than about 5 weight percent, the amount of the light exiting from the LED package 102 may be reduced by optical reflection of the metal particles 50.

Figure 6A:
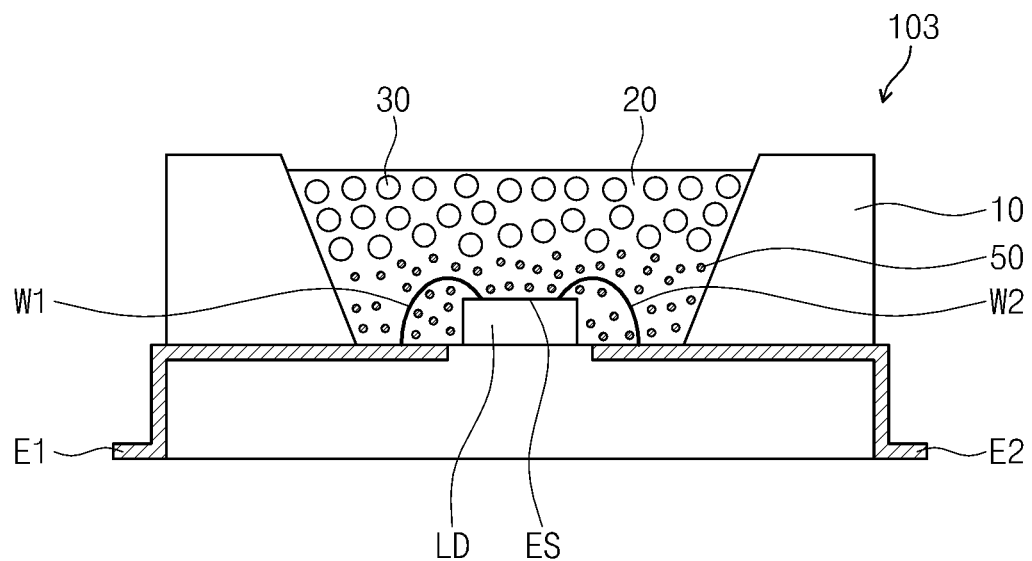
FIG. 6A is a cross-sectional view of a light emitting diode package, according to exemplary embodiments.
Figure 6B:
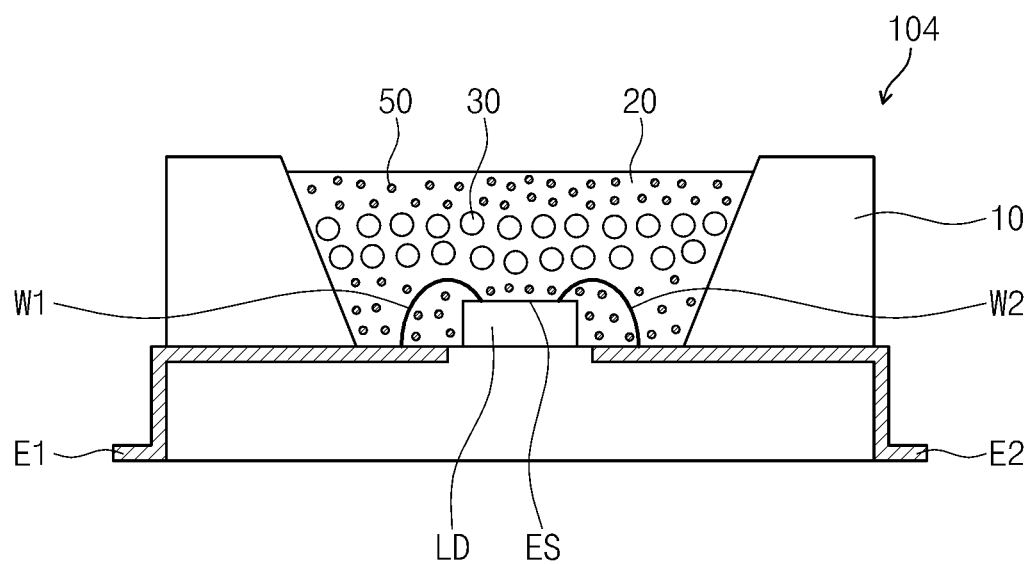
FIG. 6B is a cross-sectional view of a light emitting diode package, according to exemplary embodiments.

FIGS. 6A and 6B are a cross-sectional views light emitting diode packages, according to various exemplary embodiments. In FIGS. 6A and 6B, the same reference numerals denote the same elements as in FIGS. 1, 2A, and 2B, and therefore, to avoid obscuring exemplary embodiments disclosed herein, duplicative descriptions of the same elements will be omitted.

Referring to FIG. 6A, an LED package 103 includes light emitting particles 30 and metal particles 50, which are dispersed in the insulating layer 20. Different from the embodiment shown in FIG. 1, the metal particles 50 are dispersed to be disposed under the light emitting particles 30 in the insulating layer 20. Accordingly, the metal particles 50 are disposed closer to the light emitting diode LD than the light emitting particles 30 in the insulating layer 20.

Referring to FIG. 6B, an LED package 104 includes light emitting particles 30 and metal particles 50, which are dispersed in the insulating layer 20. Different from the embodiment shown in FIG. 1, the metal particles 50 are dispersed to be disposed above and under the light emitting particles 30 in the insulating layer 20. As such, the light emitting particles 30 are disposed between the metal particles 50.

As seen in FIGS. 6A and 6B, the light emitting particles 30 and the metal particles 50 are not randomly dispersed in the insulating layer 20 and restricted to specific regions. In this manner, the light emitting efficiency of the light emitting particles 30 may be improved by the resonant coupling of light as previously described.

Figure 7:
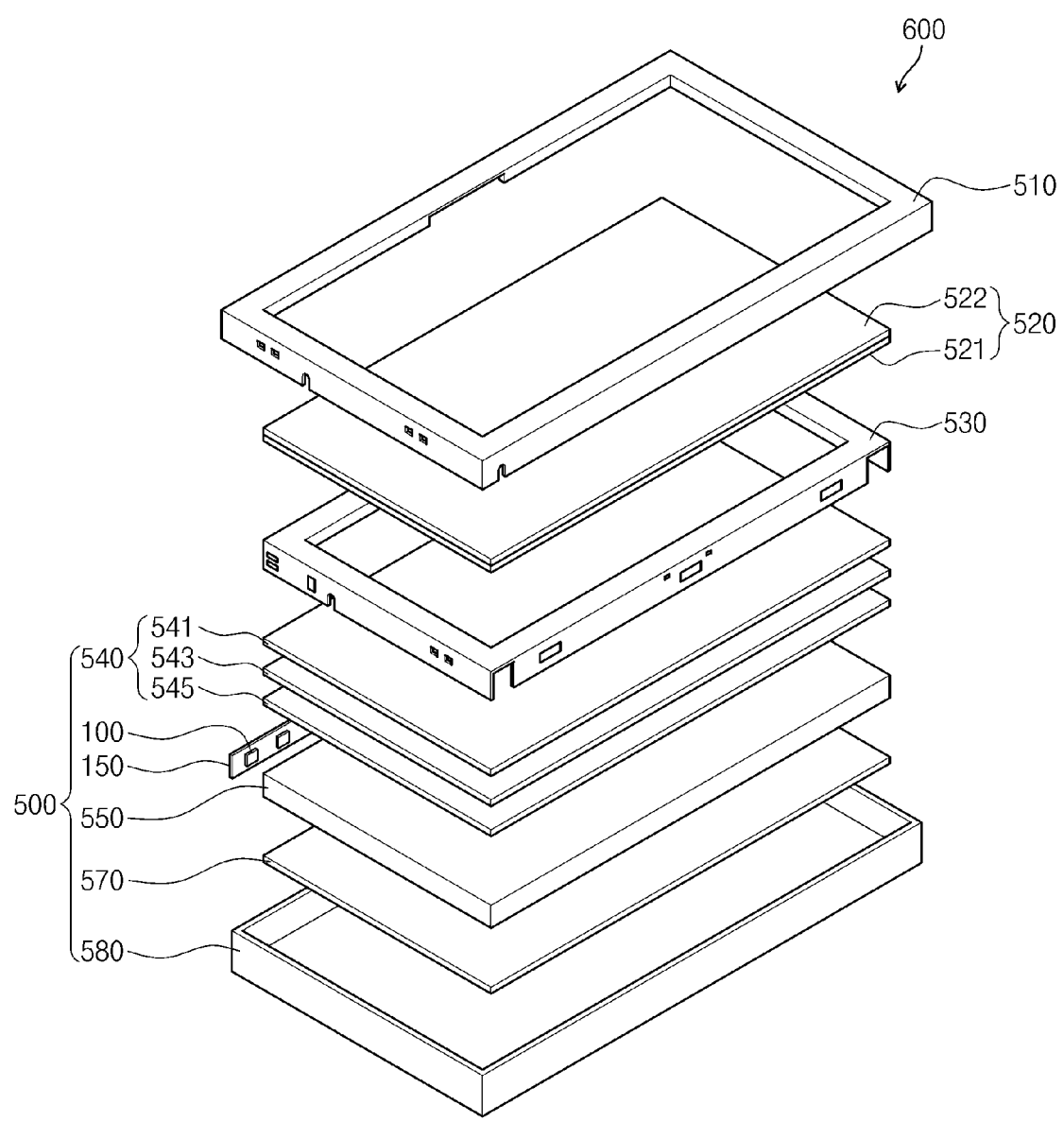
FIG. 7 is an exploded perspective view of a liquid crystal display including the light emitting diode package of FIG. 1, according to exemplary embodiments.

FIG. 7 is an exploded perspective view of a liquid crystal display including the light emitting diode package of FIG. 1, according to exemplary embodiments.

Referring to FIG. 7, a display apparatus 600 includes a backlight assembly 500 and a display panel 520. The backlight assembly 500 generates the light and the display panel 520 displays an image using the light. The backlight assembly 500 includes the LED package 100, a printed circuit board 150, a receiving container 580, a reflection plate 570, a light guide plate 550, a plurality of sheets 540, a mold frame 530, and a cover member 510.

The LED package 100 generates the light used to display the image on the display panel 520. Since the LED package 100 has the same structure and function as those of the LED package described with reference to FIG. 1, the detailed description of the LED package 100 will be omitted.

The LED package 100 is provided in a plural number and mounted on the printed circuit board 150. The LED package 100 generates the light in response to the source voltage provided via the printed circuit board 150. According to exemplary embodiments, the printed circuit board 150, on which the LED package 100 is mounted, is disposed to face a side portion of the light guide plate 550.

The receiving container 580 includes a bottom portion and a plurality of sidewalls extended from the bottom portion to accommodate (or otherwise support) the backlight assembly 500. The receiving container 580 includes a metal material to easily discharge heat generated from the LED package 100 to the outside thereof.

The light guide plate 550 is accommodated in the receiving container 580 to allow the side portion thereof to face the LED package 100. As such, the light exiting surface ES (such as illustrated in FIG. 1) of each LED package 100 faces the side portion of the light guide plate 550. In this manner, the light exiting through the light exiting surface ES may be made incident on the light guide plate 550 through the side portion of the light guide plate 550. The light incident on the light guide plate 550 is guided by a light guide pattern (not shown) of the light guide plate 550 and provided to the display panel 520.

The reflection plate 570 includes a light reflective material, e.g., polyethylene terephthalate (PET), aluminum, etc., and is disposed between the bottom portion of the receiving container 580 and the light guide plate 550. Accordingly, a portion of the light generated from the LED packages 100, which is not directed to the light guide plate 550, is reflected by the reflection plate 570 and made incident on the light guide plate 550.

The mold frame 530 is coupled to the receiving container 580 to couple an edge of the light guide plate 550 to the receiving container 580. A portion of the mold frame 530 is extended in a direction substantially parallel to the bottom portion of the receiving container 580, such that the plurality of sheets 540 and the display panel 520 are disposed on the mold frame 530.

The plurality of sheets 540 are disposed on the light guide plate 550, i.e., disposed between the light guide plate 550 and the display panel 520. The plurality of sheets 540 are configured to include optical sheets to control a path of light exiting from the light guide plate 550 and incident on the display panel 520 and a protective sheet to protect a rear surface of the display panel 520. According to exemplary embodiments, the plurality of sheets 540 includes the protective sheet 541 to protect the rear surface of the display panel 520, a prism sheet 543 to enhance a front brightness, and a diffusion sheet 545 to diffuse the light.

The display panel 520 receives the light generated by the backlight assembly 500 and displays the image using the light. In exemplary embodiments, the display panel 520 may be a liquid crystal display panel; however, it is contemplated that any other suitable display panel may be utilized, such as any suitable non-self-emissive display panel, e.g., an electrophoretic display (EPD) panel, an electro wetting display (EWD) panel, etc. When configured as a liquid crystal display, the display panel 520 includes a first substrate 521 including a plurality of pixel electrodes (not illustrated), a second substrate 522 including a common electrode (not shown), and a liquid crystal layer (not shown) disposed between the first substrate 521 and the second substrate 522.

The cover member 510 is provided with an opening portion formed there through to expose a display area of the display panel 520. The cover member 510 is coupled to the receiving container 580 to cover an edge of the display panel 520. When the cover member 510 is coupled with the receiving container 580, the display panel 520, the LED package 100, the printed circuit board 150, the reflection plate 570, the light guide plate 550, and the plurality of sheets 540 may be stably accommodated in the receiving container 580.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:
1. A light emitting diode package, comprising:
a mold comprising a receiving space;
a light emitting diode configured to emit first light of a first wavelength in a visible light range, the light emitting diode being accommodated in the receiving space;
an insulating layer disposed in the receiving space to cover the light emitting diode;

a plurality of light emitting particles dispersed in the insulating layer, the plurality of light emitting particles being configured to receive the first light to generate second light of a second wavelength, the second wavelength being different from the first wavelength; and a plurality of metal particles dispersed in the insulating layer, the plurality of metal particles being configured to receive at least one light component of the first light and the second light, wherein at least one of the plurality of metal particles is configured to cause, at least in part, reception of the at least one light component to yield surface plasmon resonance comprising a resonance wave comprising a peak wavelength in the range of the second wavelength.

2. The light emitting diode package of claim 1, wherein the first wavelength is in the range of blue light.

3. The light emitting diode package of claim 2, wherein each of the plurality of metal particles is about 1 nm to about 500 nm in size.

4. The light emitting diode package of claim 3, wherein at least one of the metal particles comprises gold and is about 1 nm to about 150 nm in size.

5. The light emitting diode package of claim 3, wherein at least one of the plurality of metal particles comprises silver and is about 1 nm to about 150 nm in size.

6. The light emitting diode package of claim 1, further comprising:
a dielectric layer disposed on a surface of at least one of the plurality of metal particles.

7. The light emitting diode package of claim 6, wherein the dielectric layer is about 1 nm to about 500 nm in thickness.

8. The light emitting diode package of claim 1, wherein the plurality of metal particles is dispersed under the plurality of light emitting particles in the insulating layer, the plurality of metal particles being closer to the light emitting diode than the plurality of light emitting particles.

9. The light emitting diode package of claim 1, wherein the plurality of light emitting particles comprise fluorescent substances.

10. The light emitting diode package of claim 9, wherein a weight ratio between the plurality of light emitting particles and the plurality of metal particles is 100:0.005 to 100:5.

11. The light emitting diode package of claim 1, wherein the plurality of light emitting particles comprise quantum dots.

12. The light emitting diode package of claim 11, wherein a weight ratio between the plurality of light emitting particles and the plurality of metal particles is 100:0.1 to 100:5.

13. A light emitting diode package, comprising:
a light emitting diode configured to emit first light of a first wavelength in a visible light range;
an insulating layer disposed on the light emitting diode;
a plurality of light emitting particles dispersed in the insulating layer, the plurality of light emitting particles being configured to receive the first light to generate second light of a second wavelength, the second wavelength being different from the first wavelength; and
a plurality of metal particles dispersed in the insulating layer, the plurality of metal particles being configured to receive at least one light component of the first light and the second light,
wherein at least one of the plurality of metal particles is configured to cause, at least in part, reception of the at least one light component to yield surface plasmon resonance comprising a resonance wave comprising a peak wavelength in the range of the second wavelength, and
wherein the plurality of metal particles comprise a first plurality of metal particles and a second plurality of metal particles, the plurality of light emitting particles being disposed between the first plurality of metal particles and the second plurality of metal particles.

14. A display apparatus, comprising:
a light emitting diode package configured to emit light; and
a display panel configured to receive the light to display an image, the light emitting diode package comprising:
a mold comprising a receiving space;
a light emitting diode configured to emit first light of a first wavelength in a visible light range, the light emitting diode being accommodated in the receiving space;
an insulating layer disposed in the receiving space to cover the light emitting diode;
a plurality of light emitting particles dispersed in the insulating layer, the plurality of light emitting particles being configured to receive the first light to generate second light of a second wavelength, the second wavelength being different from the first wavelength; and
a plurality of metal particles dispersed in the insulating layer, the plurality of metal particles being configured to receive at least one light component of the first light and the second light,
wherein at least one of the plurality of metal particles is configured to cause, at least in part, reception of the at least one light component to yield surface plasmon resonance comprising a resonance wave comprising a peak wavelength in the range of the second wavelength.

15. The display apparatus of claim 14, wherein the first wavelength is in the range of blue light.

16. The display apparatus of claim 15, wherein each of the plurality of metal particles is about 1 nm to about 500 nm in size.

17. The display apparatus of claim 16, wherein at least one of the plurality of metal particles comprises gold and is about 1 nm to about 150 nm in size.

18. The display apparatus of claim 16, wherein at least one of the plurality of metal particles comprises silver and is about 1 nm to about 150 nm in size.

19. The display apparatus of claim 14, wherein the light emitting diode package further comprises:
a dielectric layer disposed on a surface of at least one of the metal particles, the dielectric layer being about 1 nm to about 500 nm in thickness.

20. The display apparatus of claim 14, wherein the light emitting particles comprise at least one of fluorescent substances or quantum dots.

* * * * *